(12) United States Patent
Magera et al.

(10) Patent No.: US 7,459,202 B2
(45) Date of Patent: Dec. 2, 2008

(54) PRINTED CIRCUIT BOARD

(75) Inventors: Jaroslaw A. Magera, Palatine, IL (US); Gregory J. Dunn, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 12 days.

(21) Appl. No.: 11/428,454

(22) Filed: Jul. 3, 2006

(65) Prior Publication Data
US 2008/0003414 A1 Jan. 3, 2008

(51) Int. Cl.
*B32B 15/00* (2006.01)
*H05K 1/00* (2006.01)

(52) U.S. Cl. .................. 428/209; 174/250; 174/255; 174/261; 174/264

(58) Field of Classification Search ......... 174/260–266, 174/250–255; 361/792–795; 428/209
See application file for complete search history.

(56) References Cited

U.S. PATENT DOCUMENTS

| | | | | |
|---|---|---|---|---|
| 3,859,711 A | * | 1/1975 | McKiddy | 29/593 |
| 4,521,262 A | * | 6/1985 | Pellegrino | 156/150 |
| 4,675,788 A | * | 6/1987 | Breitling et al. | 361/792 |
| 5,442,144 A | * | 8/1995 | Chen et al. | 174/266 |
| 5,538,433 A | * | 7/1996 | Arisaka | 439/70 |
| 6,010,769 A | * | 1/2000 | Sasaoka et al. | 428/209 |
| 6,143,116 A | | 11/2000 | Hayashi et al. | |
| 6,195,882 B1 | | 3/2001 | Tsukamoto et al. | |
| 6,207,259 B1 | | 3/2001 | Iino et al. | |
| 6,518,514 B2 | | 2/2003 | Suzuki et al. | |
| 6,617,509 B1 | * | 9/2003 | Bergstedt et al. | 174/36 |
| 6,618,940 B2 | * | 9/2003 | Lubert et al. | 29/846 |
| 6,680,441 B2 | * | 1/2004 | Kondo et al. | 174/260 |
| 6,930,256 B1 | * | 8/2005 | Huemoeller et al. | 174/260 |
| 7,022,399 B2 | * | 4/2006 | Ogawa et al. | 428/209 |

* cited by examiner

*Primary Examiner*—Cathy Lam
(74) *Attorney, Agent, or Firm*—James Lamb; Valerie M. Davis

(57) ABSTRACT

A sequentially laminated printed circuit board having highly reliable vias can be fabricated by pattern plating flanges or via lands on a copper foil, laminating the foil to a prepreg so that the flanges are embedded into the surface of the prepreg, creating via holes in the laminate that are substantially concentric with the individual flanges, plating the via holes with copper, chemically or mechanically milling off a portion of the copper plating and optionally some of the copper foil to reduce the overall thickness of the laminate, and laminating a second and optionally a third prepreg to the laminate. The resulting printed circuit board has the flanges embedded in the surface of the laminate so that the inside wall of the flange is electrically and mechanically attached to the outside wall of the plated through hole barrel.

17 Claims, 3 Drawing Sheets

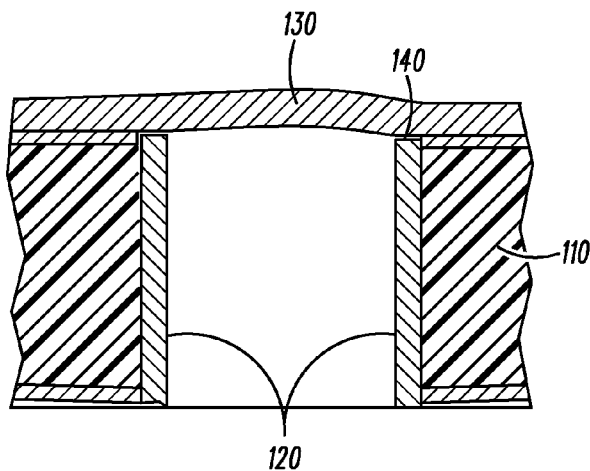
FIG. 1
—PRIOR ART—
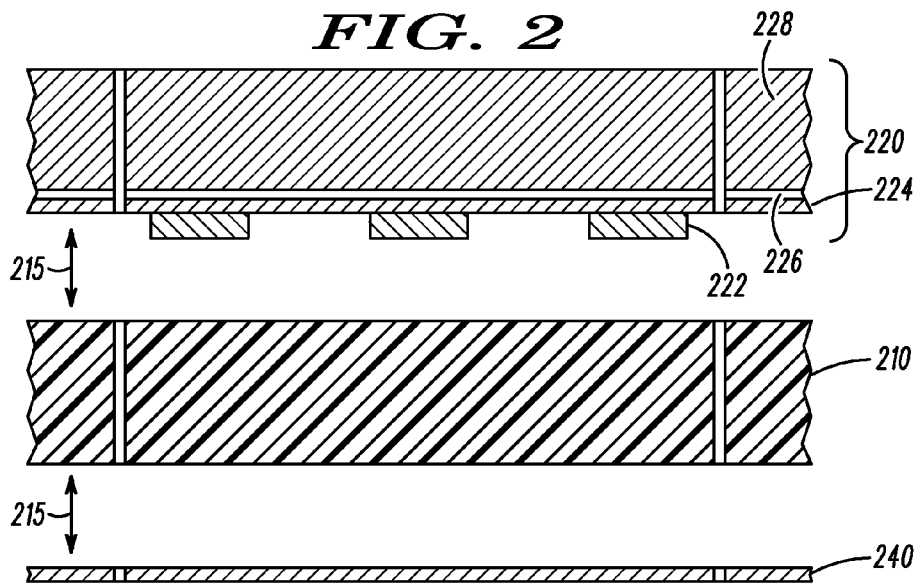
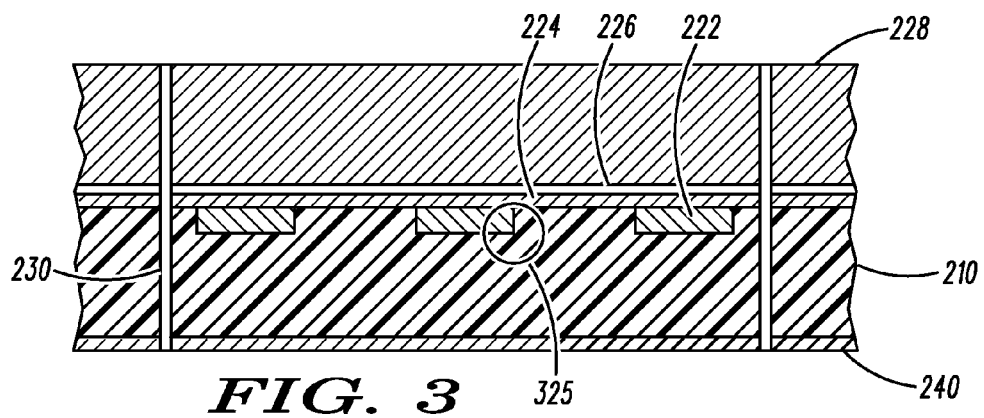

PRINTED CIRCUIT BOARD

FIELD OF THE INVENTION

This invention relates generally to printed circuit boards. More particularly, this invention relates to sequentially laminated printed circuit boards having via structures.

BACKGROUND

Sequentially laminated printed circuit boards are multilayer boards that contain blind vias. One or more sub-assemblies, for example two two-layer boards or two four-layer boards, are first drilled, plated, and patterned. Then the sub-assemblies are laminated together and the entire assembly is drilled, plated, and patterned again. The several plating steps required to plate the vias in this multiplicity of steps produces relatively thick copper on the board surfaces. This thick copper precludes the formation of fine circuit traces when using isotropic wet etching. To avoid this problem, it is common practice to reduce the copper thickness by mechanical grinding or chemical etching. Neither process is highly uniform, repeatable, or controllable. Referring now to FIG. 1, the copper can easily be reduced too much, resulting in "butt joints" 140 between the barrel 120 of the via and the surface copper 130 at the top edge of the via. Butt joints are latent defects that result in intermittent contacts or open circuits when the laminate 110 expands faster during thermal excursions than the copper plating 120, causing the two metal members to separate. This results in field failures, and it is highly desirable to eliminate this reliability risk. It would be a significant addition to the art if a multilayer printed circuit board could be fabricated that could meet strict dimensional tolerances and still have highly reliable via structures.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 1 is a cross-sectional view of a via of a printed circuit board as practiced in the prior art.

FIG. 2 is an exploded cross-sectional view of a printed circuit board at an early stage in the process of forming a via structure, in accordance with certain embodiments of the present invention.

FIG. 3 is a cross-sectional view of a printed circuit board after a first lamination, in accordance with certain embodiments of the present invention.

DETAILED DESCRIPTION

Figure 4:
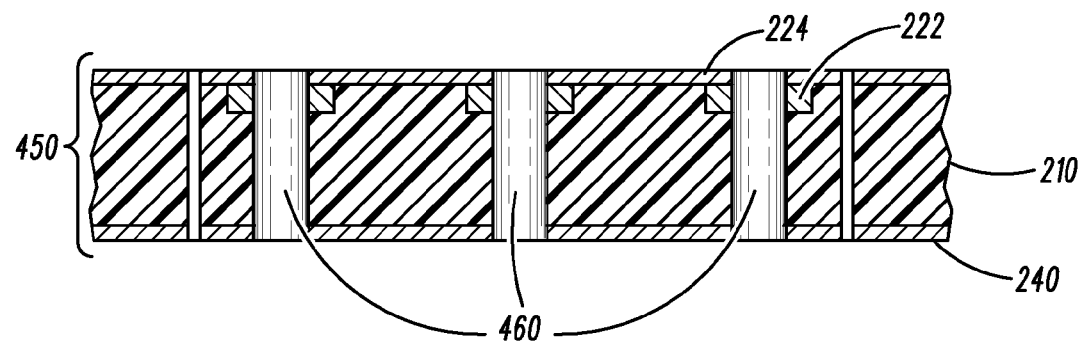
FIG. 4 is a cross-sectional view of a printed circuit board after drilling vias, in accordance with certain embodiments of the present invention.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms "substantial" and "substantially" are intended to have their ordinary meanings of "largely but not wholly that which is specified," and are terms of degree that should not be interpreted as having a strict numerical limitation, implying "approximate" rather than "perfect".

A thick flange that will be incorporated in a via structure in a later step is pattern plated on a sheet of copper attached to a peelable support layer such as a thicker copper sheet with a thin interfacial release layer. The copper surface is roughened to enhance adhesion to a prepreg. This multilayer copper structure is then laminated to a first major surface of the prepreg, while a second such multilayer copper structure, a second ordinary copper foil, or a printed circuit board subassembly comprising one or more layers of copper and one or more layers of dielectric is laminated to a second major surface of the prepreg. The support or carrier layer is peeled away, leaving a copper sheet with thicker regions embedded in the prepreg. The board is drilled and plated in the conventional manner. The surface copper is then thinned by mechanical or chemical means, without the risk of exposing the copper barrel in the vias. Even if the entire thickness of field copper is removed, the thick flange provides a highly reliable joint. Optionally, a thin etch stop layer of a metal other than copper, such as nickel, can be employed to ensure that the flange is not etched away. Referring now to FIG. 2, a printed circuit board (PCB) having via structures is created by beginning with a prepreg laminate 210. Prepreg laminates are well known to those skilled in the art, and are typically made from materials such as glass reinforced epoxy, or glass reinforced polyimide. Prepregs are thermoset materials, and are generally thin, ranging between 0.002 and 0.020 inches, and are generally processed while they are in a deformable state, that is in a partially cured "B-stage". In this partially cured state, the laminates are deformable, and will yield and flow if significant pressure and/or heat is applied to them. Once they are fully cured, they are generally considered to be rigid and non-deformable.

Via lands or flanges 222 are pattern plated as pads on a sheet of copper foil 224 that is attached to a peelable support or carrier layer 228 (such as a thicker copper sheet) that can be subsequently removed from the copper foil. The use of a thin release layer 226 at the interface aids in removing the carrier layer 228 from the copper foil. These copper flanges will subsequently serve as a collar around plated through holes that will be formed in the laminate. Although the via lands or flanges are commonly circular, they can also be polygons having 3 to N sides, where N is an integer, or they can be irregularly shaped. For example, the copper flanges can be shaped as diamond, triangular, square, rectangular, pentagonal, hexagonal, octagonal, round, elliptical, or polygonal. The lands therefore should be arranged in such a manner that they correspond precisely to the location of the plated through holes that will be subsequently drilled. The via lands or flanges 222 can be formed in a number of ways, for example, patterned plated using conventional photolithographic techniques. The flanges are plated to a thickness that is greater than the thickness of the plating on the walls of the plated through holes, typically 1 to 2 mils. In one illustrative implementation, the thickness of the flanges is equal to or greater than 1.5 times the thickness of the plating on the walls of the plated through holes. In another illustrative implementation, the thickness of the flanges is equal to or greater than two times the thickness of the plating on the walls of the plated through holes. The exposed surface of the plated copper lands is then roughened using techniques such as mechanical abrasion, chemical etching, and/or depositing additional materials such as copper oxides, in order to increase the adhesion of the flanges to the prepreg laminate in a subsequent lamination step. The plated copper flanges on the carrier assembly 220 are then bonded to one surface of the prepreg laminate, as indicated by the arrows 215. Referring now to FIG. 3, during this step the copper flanges 222 become embedded into the surface of the prepreg 210 by the pressure and heat of the laminating press. Since the flanges protrude above the surface of the copper foil, the prepreg is deformed locally 325 around the flanges as it softens in the press. The support or carrier layer 228 is then peeled away, leaving a multilayer laminated structure that consists of the copper foil 224 bonded to the prepreg, the flanges 222 embedded in and bonded to the prepreg, and the prepreg 210. Referring now to FIG. 4, holes 460 or apertures are then formed in this multilayer laminated structure in conventional manner, such as mechanical drilling, piercing, punching, or laser drilling. The holes extend completely through the laminated structure, including the via lands or flanges and the copper foil.

Figure 5:
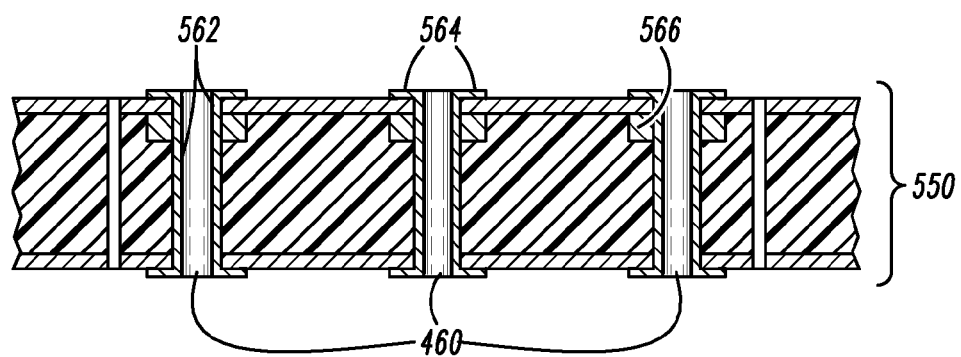
FIG. 5 is a cross-sectional view of a printed circuit board after plating the vias, in accordance with certain embodiments of the present invention.

Since the alignment of plated through holes or via in a printed circuit board is critically important with respect to the location of other features such as circuit traces, the edges of the printed circuit board, and other holes, fiducial holes 230 in both the prepreg 210 and the copper foil 224 are used to align the foil to the laminate. This ensures that the holes 460 drilled in the laminate will be substantially concentric to the each of the flanges 222. "Substantially" is intended to mean "largely but not wholly that which is specified," and should not be interpreted as having a strict numerical limitation, but instead implying "approximate" rather than "perfect". Since the flanges are intended to serve as a "reinforcement" around a top portion of the plated thru hole, it is important that the holes in the prepreg be accurately located with respect to the center line of the flange. While it is not a requirement that the flange be perfectly concentric to a central axis of the hole, dimensional tolerances should be maintained to such a level that the flange ends up located with respect to the hole such that most or all of the hole falls within the outer circumference of the flange. The multilayer structure is then plated (FIG. 5) in conventional manner in order to form plating 562 along the walls of the drilled holes. During the plating step, copper is also plated on the exposed surface 564 of the copper foil. Since a central portion of the flange has been drilled out, copper is also plated on the interior walls of the flange during the plating step. The plated copper on the walls of the drilled holes forms a "barrel" 562 which extends completely from one side of the multilayer structure to the other. During the plating step, a portion 566 of the outer wall of the plated copper barrel becomes attached to an interior vertical wall of the flange.

In the fabrication of a multilayer printed circuit laminate 550, it is important to maintain precise control of the thickness of each layer, so that the resulting laminated structure will not exceed certain dimensional tolerances. Also, it is desirable to have the surface copper as thin as possible to facilitate the patterning of fine copper lines and spaces by isotropic wet etching. For these reasons, the plated copper 564 on the surface is often thinned or reduced by a chemical milling or mechanical milling step. In prior art systems this resulted in a thinned portion of copper around the outer portion or "land" area, creating either a butt joint or a very weak knee, as seen in prior art FIG. 1. In contrast, with our invention, even in the most extreme case of milling, the embedded flange 222 remains intact and the joint between the plated through hole and the flange is reliable.

Figure 6:
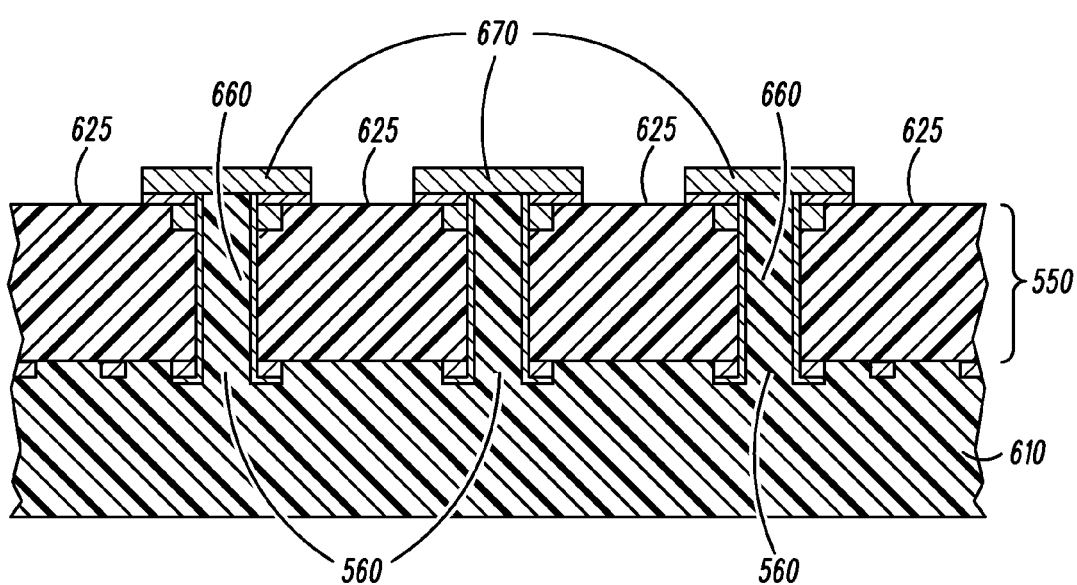
FIG. 6 is a cross-sectional view of a printed circuit board after a second lamination, in accordance with certain embodiments of the present invention.

Referring now to FIG. 6, another layer of dielectric medium 610 can be optionally applied to the laminated structure 550. Although shown in the drawings on only the bottom side of the PCB, this additional layer 610 can be placed on either or both sides of the structure 550. In one embodiment, an additional layer of prepreg is laminated to the multilayer structure on a side opposite the side that contains the flanges. The additional layer of prepreg is bonded to the original one using heat and pressure in conventional means. During this laminating step, resin portions 660 of the additional layer of prepreg flow into and fill the interior of the plated through holes 560. Optionally, an additional layer of plating 670, known as cap plating, is plated on the exposed portion of the laminate over the filled portion of the plated through hole, and optionally, above the flange. In one embodiment, the cap plating 670 does not extend over exposed portions 625 of the PCB.

In summary, without intending to limit the scope of the invention, fabrication of a sequentially laminated printed circuit board according to a method consistent with certain embodiments of the invention can be carried out by pattern plating flanges or via lands on a copper foil, laminating the foil to a prepreg so that the flanges are embedded into the surface of the prepreg, creating via holes in the laminate that are substantially concentric with the individual flanges, plating the via holes with copper, chemically or mechanically milling off a portion of the copper plating and optionally some of the copper foil to reduce the overall thickness of the laminate, and laminating a second and optionally a third prepreg to the laminate. Those skilled in the art will recognize that the present invention has been described in terms of exemplary embodiments based upon use of glass reinforced prepregs and copper plating. However, the invention should not be so limited, since other variations will occur to those skilled in the art upon consideration of the teachings herein. For example, the copper foil that the flanges are formed upon can also be patterned after lamination to the prepreg in order to form circuit conductors and pads for attaching surface mount components such as resistors, capacitors, integrated circuit packages, etc. Accordingly, it is intended that the present invention embrace all such alternatives, modifications and variations as fall within the scope of the appended claims.

What is claimed is:

1. A printed circuit board, comprising:
   a deformed thermoset dielectric medium, comprising a polymer, having a major surface;
   one or more apertures formed in the deformed thermoset dielectric medium, each aperture having a layer of copper deposited on aperture walls thereof;
   a copper flange embedded into the major surface of the deformed thermoset dielectric medium and substantially concentric to a central axis of the aperture, wherein interior vertical walls of the flange are attached to an outer portion of the layer of copper on the aperture wall, wherein the thickness of the copper flange is equal to or greater than two times the thickness of the layer of copper on the aperture walls; and a copper foil situated on at least portions of the major surface of the deformed thermoset dielectric medium, with portions of the copper foil overlying the copper flange.

2. The printed circuit board as described in claim 1, wherein the deformed thermoset dielectric medium further comprises glass fiber reinforcement in the polymer.

3. The printed circuit board as described in claim 1, further comprising an additional layer of dielectric medium on a surface of the deformed thermoset dielectric medium opposite the major surface.

4. The printed circuit board as described in claim 3, wherein the aperture is filled with portions of the additional layer of dielectric medium.

5. The printed circuit board as described in claim 4, further comprising an additional copper plating situated on the filled portion of the aperture, and on the copper foil.

6. The printed circuit board as described in claim 1, wherein the copper foil situated on at least portions of the major surface of the deformed thermoset dielectric medium comprises circuit conductors.

7. The printed circuit board as described in claim 1, wherein the copper flanges are shaped as diamond, triangular, square, rectangular, pentagonal, hexagonal, octagonal, round, elliptical, or polygonal.

8. The printed circuit board as described in claim 1, wherein the thickness of the copper flange is greater than 1.0 mil and greater than the thickness of the layer of copper on the aperture walls.

9. A printed circuit board, comprising:
a glass-reinforced thermoset polymer substrate, having a major surface;
one or more apertures formed in the glass-reinforced thermoset polymer substrate, each aperture having a layer of copper deposited on aperture walls thereof, and filled with the polymer;
a copper flange embedded into the major surface of the glass-reinforced thermoset polymer substrate and substantially concentric to a central axis of the aperture, wherein interior vertical walls of the flange are attached to an outer portion of the layer of copper on the aperture wall, and wherein the thickness of the copper flange is greater than 1.0 mil and equal to of greater than 1.5 times the thickness of the layer of copper on the aperture wall; and a copper foil situated on at least portions of the major surface of the glass-reinforced thermoset polymer substrate, with portions of the copper foil overlying the copper flange.

10. The printed circuit board as described in claim 9, wherein the copper foil situated on at least portions of the major surface of the glass-reinforced thermoset polymer substrate comprises circuit conductors.

11. The printed circuit board as described in claim 9, further comprising an additional layer of a glass-reinforced thermoset polymer substrate on a surface of the glass-reinforced thermoset polymer substrate opposite the major surface.

12. The printed circuit board as described in claim 9, wherein the shape of the copper flanges is selected from the group consisting of diamond, triangular, square, rectangular, pentagonal, hexagonal, octagonal, round, elliptical, and polygonal.

13. The printed circuit board as described in claim 9, further comprising an additional copper plating situated on the filled portion of the aperture, and on the copper foil.

14. A printed circuit board, comprising:
a first glass-reinforced thermoset polymer substrate having a plurality of plated-through-holes therein, at least some of the plated-through-holes having a copper collar situated around an upper periphery thereof and embedded in the surface of the substrate such that an interior wall of the collar is attached to an exterior wall of a barrel of the plated-through-hole, and such that the thickness of the copper collar is greater than 1.0 mil and equal to or greater than 1.5 times the the thickness of the barrel;
a copper foil attached to a non-embedded portion of the collar and to portions of the surface of the first glass-reinforced thermoset polymer substrate; and
a second glass-reinforced thermoset polymer substrate laminated to an opposing surface of the first glass-reinforced thermoset polymer substrate, portions of the second glass-reinforced thermoset polymer substrate filling the at least some of the plated-through-holes.

15. The printed circuit board as described in claim 14, wherein the copper foil comprises circuit conductors.

16. The printed circuit board as described in claim 14, wherein the shape of the copper flanges is selected from the group consisting of diamond, triangular, square, rectangular, pentagonal, hexagonal, octagonal, round, elliptical, and polygonal.

17. The printed circuit board as described in claim 14, further comprising an additional copper plating situated on the filled portion of the plated-through-hole, and on the copper foil.

* * * * *